US008895230B2

(12) United States Patent
Krishnamurthy et al.

(10) Patent No.: US 8,895,230 B2
(45) Date of Patent: Nov. 25, 2014

(54) SPIN-ON CARBON COMPOSITIONS FOR LITHOGRAPHIC PROCESSING

(71) Applicant: Brewer Science Inc., Rolla, MO (US)

(72) Inventors: Vandana Krishnamurthy, Rolla, MO (US); Daniel M. Sullivan, Rolla, MO (US); Yubao Wang, Rolla, MO (US); Qin Lin, Rolla, MO (US); Sean Simmons, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 13/648,890

(22) Filed: Oct. 10, 2012

(65) Prior Publication Data
US 2013/0089716 A1  Apr. 11, 2013

Related U.S. Application Data

(60) Provisional application No. 61/545,313, filed on Oct. 10, 2011.

(51) Int. Cl.
| | |
|---|---|
| *G03F 7/26* | (2006.01) |
| *C08G 73/10* | (2006.01) |
| *G03F 7/09* | (2006.01) |
| *H01L 21/308* | (2006.01) |
| *H01L 21/033* | (2006.01) |
| *C09D 179/08* | (2006.01) |
| *C08G 73/00* | (2006.01) |

(52) U.S. Cl.
CPC ............ *C08G 73/00* (2013.01); *C08G 73/1075* (2013.01); *G03F 7/094* (2013.01); *C08G 73/1078* (2013.01); *H01L 21/3081* (2013.01); *C08G 73/1067* (2013.01); *H01L 21/0332* (2013.01); *C09D 179/08* (2013.01)
USPC ........................... 430/311; 430/330; 430/322

(58) Field of Classification Search
CPC ......... G03F 7/039; G03F 7/091; G03F 7/094; H01L 21/0332; H01L 2924/01006; H01L 2924/14
USPC .................................................. 430/322, 311
See application file for complete search history.

(56) References Cited

U.S. PATENT DOCUMENTS 6,927,012 B2 *   8/2005   Hatanaka et al.
7,754,818 B2 *   7/2010   Devadoss et al.
(Continued)

FOREIGN PATENT DOCUMENTS

JP       2003-286018      * 10/2003

OTHER PUBLICATIONS

Someya et al., "Spin-on-Carbon-Hardmask with high wiggling resistance," Proc. of SPIE, 2012, vol. 8325, 83250U-1-83250U-6.*

(Continued)

*Primary Examiner* — Caleen Sullivan
(74) *Attorney, Agent, or Firm* — Hovey Williams LLP

(57) ABSTRACT

The invention described herein is directed towards spin-on carbon materials comprising polyamic acid compositions and a crosslinker in a solvent system. The materials are useful in trilayer photolithography processes. Films made with the inventive compositions are not soluble in solvents commonly used in lithographic materials, such as, but not limited to PGME, PGMEA, and cyclohexanone. However, the films can be dissolved in developers commonly used in photolithography. In one embodiment, the films can be heated at high temperatures to improve the thermal stability for high temperature processing. Regardless of the embodiment, the material can be applied to a flat/planar or patterned surface. Advantageously, the material exhibits a wiggling resistance during pattern transfer to silicon substrate using fluorocarbon etch.

19 Claims, 4 Drawing Sheets

(56) References Cited

U.S. PATENT DOCUMENTS

2001/0009296 A1* 7/2001 Carter et al.
2009/0035590 A1* 2/2009 Sullivan et al.
2010/0081082 A1* 4/2010 Yoshimura et al.
2012/0034419 A1* 2/2012 Washburn et al.
2013/0011630 A1* 1/2013 Sullivan et al. ............ 428/195.1

OTHER PUBLICATIONS

International Search Report and Written Opinion dated Mar. 26, 2013, in corresponding PCT/US2012/059565 filed on Oct. 10, 2012.*

* cited by examiner

US 8,895,230 B2

SPIN-ON CARBON COMPOSITIONS FOR LITHOGRAPHIC PROCESSING

RELATED APPLICATIONS

This application claims the priority benefit of a provisional application entitled SPIN-ON CARBON COMPOSITIONS FOR LITHOGRAPHIC PROCESSING, Ser. No. 61/545,313, filed Oct. 10, 2011, incorporated by reference herein.

BACKGROUND OF THE INVENTION

1. Field of the Invention

The present invention relates to methods of forming a carbon-rich (spin-on carbon) layer from a polyamic acid for use in a multilayer stack and the microelectronic structures thereof.

2. Description of the Prior Art

As the semiconductor industry continues to shrink the size of features, a single layer photoresist lacks sufficient thickness to complete pattern transfer to a substrate. As a result, trilayer stacking (photoresist-hardmask-carbon layers) is typically used to transfer the pattern made by the photoresist to the substrate. The carbon layer can be formed by chemical vapor deposition (CVD) or spin-coating. However, CVD processes are expensive, have low-throughput, and subject the wafer to harsh conditions. Currently, epoxy cresol novolacs are the most common material for fabrication of spin-on carbon ("SOC") layers, but this material has low thermal stability and low carbon content, leading to high sublimation and poor wiggling resistance during pattern transfer to silicon substrates. Additionally such a layer is difficult to remove after curing. Other SOC layers have been formed that are removable by dry etching. However, drying etching requires harsh processing conditions and special equipment, making the process less than desirable.

There is a need for improved SOC layers that exhibit high thermal stability and optical constants, while also being wet removable (developer soluble). Furthermore, these layers should prevent or minimize line "wiggling," which is present in many prior art processes.

SUMMARY OF THE INVENTION

The present invention provides a method of forming a microelectronic structure. The method comprises providing a substrate having a surface. Optionally, one or more intermediate layers are formed on the surface, there being an uppermost intermediate layer on the surface, if one or more intermediate layers are present. A composition is applied to the uppermost intermediate layer, if present, or to the substrate surface, if no intermediate layers are present. The composition comprises a polyamic acid dissolved or dispersed in a solvent system. The composition is heated to form a spin-on carbon or carbon-rich layer, with the carbon-rich layer being developer soluble, and exhibiting a weight loss of less than about 10% at a temperature of about 400° C. for about 10 minutes.

The invention also provides a novel microelectronic structure. The structure comprises a microelectronic substrate having a surface and optionally one or more intermediate layers on the surface. There is an uppermost intermediate layer on the surface, if one or more intermediate layers are present. A carbon-rich layer is on the uppermost intermediate layer, if present, or on the substrate surface, if no intermediate layers are present. The carbon-rich layer: comprises a crosslinked polyamic acid; is developer soluble; and exhibits a weight loss of less than about 10% at a temperature of about 400° C. for about 10 minutes.

BRIEF DESCRIPTION OF THE DRAWING FIGURES

DETAILED DESCRIPTION OF THE PREFERRED EMBODIMENTS

Detailed Description

Methods of the Invention

Figure 1:
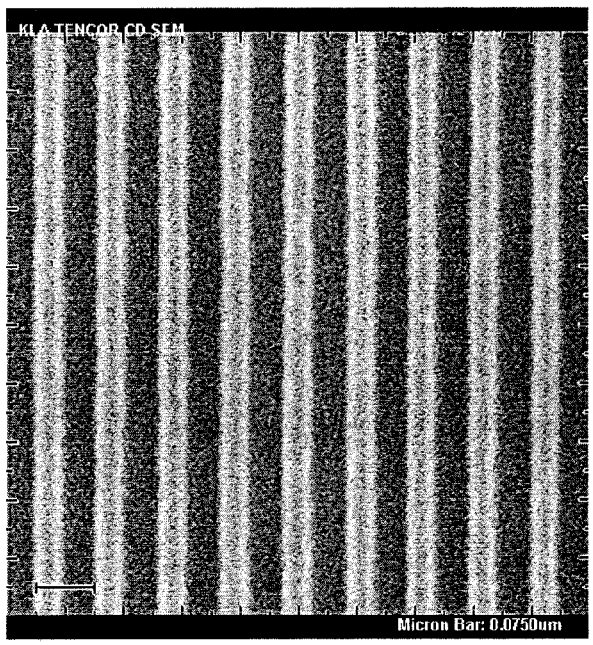
FIG. 1 is a scanning electron microscope ("SEM") photograph of the positive-tone development photolithography (40L/80P, 16.8 mJ) demonstrated in Example 26.

In more detail, the present invention provides methods of forming microelectronic structures and is particularly suited for multilayer processes. In the inventive method, one or more optional intermediate layers are applied to the surface of a substrate. Suitable intermediate layers include those selected from the group consisting of spin-on hardmask, CVD hardmask, and spin-on carbon layers (without polyamic acids). Any conventional microelectronic substrate can be utilized. Preferred substrates include those selected from the group consisting of silicon, SiGe, $SiO_2$, $Si_3N_4$, SiON, aluminum, tungsten, tungsten silicide, gallium arsenide, germanium, tantalum, tantalum nitride, coral, black diamond, phosphorous or boron doped glass, $Ti_3N_4$, hafnium, $HfO_2$, ruthenium, indium phosphide, and mixtures of the foregoing. The substrate surface can be planar, or it can include topography features (via holes, trenches, contact holes, raised features, lines, etc.). As used herein, "topography" refers to the height or depth of a structure in or on a substrate surface.

A polyamic acid composition is applied to uppermost intermediate layer, if present, or to the substrate surface, if no intermediate layers are present, to form a layer on the substrate surface. The composition can be applied by any known application method, with one preferred method being spin-coating the composition at speeds of from about 500 rpm to about 5,000 rpm (preferably from about 1,000 rpm to about 2,000 rpm) for a time period of from about 5 seconds to about 120 seconds (preferably from about 30 seconds to about 60 seconds). After the composition is applied, it is preferably heated to a temperature of from about 200° C. to about 450° C., and more preferably from about 205° C. to about 400° C. and for time periods of from about 10 seconds to about 120 seconds (preferably from about 30 seconds to about 90 seconds) to evaporate solvents. Baking will initiate a crosslinking reaction to cure the layer, thus forming the carbon-rich layer, which will comprise a crosslinked polyamic acid. The term "carbon-rich layer" as used herein, refers to layers comprising greater than about 50% by weight carbon, preferably greater than about 60% by weight carbon, more preferably greater than about 70% by weight carbon, and even more preferably from about 70% to about 99% by weight carbon, based upon the weight of the layer taken as 100% by weight. These carbon-rich layers will also preferably have a low hydrogen content (e.g., less than about 10% by weight hydrogen, preferably less than about 5% by weight hydrogen, more preferably less than about 3% by weight hydrogen, and even more preferably from about 0.01% to about 2% by weight hydrogen, based upon the weight of the layer taken as 100% by weight).

The average thickness of the carbon-rich layer (determined after baking) is preferably from about 0.05 µm to about 10 µm, more preferably from about 0.1 µm to about 5.0 µm, and even more preferably from about 0.1 µm to about 2.0 µm. If the substrate surface includes topography, the carbon-rich layer is preferably formed at a thickness sufficient to substantially cover the substrate topography and to achieve the above average thicknesses over the topography. The compositions used in the inventive methods exhibit excellent gap-fill properties and can fill deep contact holes very well.

Depending upon the exact polyamic acid composition used to form the carbon-rich layer (discussed in more detail below), the dried or crosslinked carbon-rich layer can have a refractive index (n value) of at least about 1.40, preferably from about 1.45 to about 1.70, and more preferably from about 1.50 to about 1.65 at the wavelength of use (e.g., 365 nm, 248 nm, 193 nm, 157 nm, or 13.5 nm).

The dried or crosslinked carbon-rich protective layer will be substantially insoluble in typical organic solvents used to form subsequent layers in the multilayer stack, such as propylene glycol methyl ether acetate (PGMEA), propylene glycol monomethyl ether (PGME), ethyl lactate, propylene glycol n-propyl ether, gamma-butyrolactone, cyclopentanone, cyclohexanone, n-butyl acetate, methyl isobutyl carbinol (MIBC), and mixtures thereof. Thus, when subjected to a stripping test, the carbon-rich layer will have a percent stripping of less than about 5%, preferably less than about 1%, and more preferably about 0%. The stripping test involves first determining the thickness by taking the average of measurements at five different locations of the layer. This is the initial average film thickness. Next, the film is rinsed with a solvent (e.g., ethyl lactate) for about 30 seconds, followed by spin drying at about 500-3,000 rpm for about 20-60 seconds to remove the solvent. The thickness is measured again at those five points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

Although typically insoluble in organic solvents, the carbon-rich layer is soluble or capable of being rendered soluble in conventional aqueous developers (e.g., photoresist developers). That is, the term "developer-soluble" as used herein means that the carbon-rich layer is capable of being removed with conventional aqueous developers (e.g., hydroxides and/or any alkaline/base chemistry solutions). Particularly preferred developers are selected from the group consisting of tetramethyl ammonium hydroxide (TMAH), potassium hydroxide (KOH), sodium hydroxide, and mixtures thereof. Thus, the carbon-rich layer advantageously can be removed during processing without dry etching (e.g., reactive ion etching), and is preferably not subjected to any dry etching in the method of the invention.

The carbon-rich layer is preferably not photosensitive (i.e., a pattern cannot be defined in the layer when it is exposed to about 1 J/cm$^2$), and thus, photosensitive compositions such as photoresists or other imaging layers are not suitable for use as carbon-rich layers of the invention.

Advantageously, the carbon-rich layer exhibits high thermal stability, making it particularly useful in high temperature processes such as deposition of an inorganic mask by CVD. In this embodiment, the crosslinked polyamic acid layer can be heated at a higher temperature (i.e., from about 300° C. to about 450° C., and preferably from about 350° C. to about 400° C.) to promote imidization. The high thermal stability can be observed by TGA. Specifically, at a temperature of about 400° C. for about 10 minutes, the carbon-rich layer will experience a weight loss of less than about 10%, preferably less than about 5%, and preferably about 0%.

The carbon-rich layers will also have low sublimation. At temperatures of from about 205° C. to about 225 ° C., and following the sublimation testing described in Example 31, carbon-rich layers according to the invention will have a sublimation of less than about 1,500 ng, preferably less than about 1,000 ng, and even more preferably less than about 500 ng.

Finally, the carbon-rich layers form SOC patterns that minimize or prevent line deformation or line "wiggling." Line wiggling is undesirable and prevents good pattern transfer to the underlaying layers and ultimately the substrate. Thus, improved patterning is achieved with the present invention.

After formation of the carbon-rich layer on the substrate surface, one or more additional intermediate layers can optionally be formed adjacent (i.e., on top of) the carbon-rich layer. Examples of such additional intermediate layers include those selected from the group consisting of etch block layers, pattern transfer layers, and photoresists. The additional intermediate layer can be formed by any known application method, with one preferred method being spin-coating at speeds of from about 1,000 to about 5,000 rpm (preferably from about from about 1,250 to about 1,750 rpm) for a time period of from about 30 to about 120 seconds (preferably from about 45 to about 75 seconds).

If an intermediate etch block layer is utilized, it preferably comprises carbon compounds, metal compounds, or silicon compounds (e.g., $Si_3N_4$, $SiO_2$, SiC, or SiON). The thickness of the etch block layer will vary, but is preferably from about 0.1 nm to about 100 nm, more preferably from about 1 nm to about 20 nm, and even more preferably from about 5 nm to about 10 nm.

The most preferred intermediate layer is a pattern transfer layer (hardmask) formed adjacent the carbon-rich layer. The pattern transfer layer can he formed by any known application method, with one preferred method being spin-coating at speeds of from about 1,000 to about 5,000 rpm (preferably from about from about 1,000 to about 2,000 rpm) for a time period of from about 30 to about 120 seconds (preferably from about 45 to about 60 seconds). Chemical vapor deposition can also be used to form the pattern transfer layer. The pattern transfer layer can then be heated to a temperature of from about 100° C. to about 300° C., and more preferably from about 160° C. to about 205 ° C. and for a time period of from about 30 seconds to about 120 seconds (preferably from about 45 seconds to about 60 seconds) to evaporate solvents. The thickness of the pattern transfer layer after baking is preferably from about 1 nm to about 1,000 nm, more preferably from about 20 nm to about 100 nm, and even more preferably from about 30 nm to about 50 nm. Suitable compositions for use in forming the pattern transfer layer include hardmask materials (e.g., silicon- or metal-containing hardmasks and hybrid hardmasks) or spin-on glass materials (e.g., silicates, phosphosilicates, siloxanes).

An imaging layer is then formed on the stack. The imaging layer can be formed by any known application method, with one preferred method being spin-coating at speeds of from about 500 to about 5,000 rpm (preferably from about from about 1,000 to about 2,000 rpm) for a time period of from about 30 to about 120 seconds (preferably from about 45 to about 60 seconds) onto the additional intermediate layers, if present, or onto the carbon-rich layer, if no additional intermediate layers are present. The imaging layer is post-application baked at a temperature of at least about 90° C., and preferably from about 90° C. to about 130° C., for time periods of from about 30 seconds to about 120 seconds (preferably 45 to about 60 seconds). Suitable imaging compositions include commercially-available photoresists (e.g., TArF Pi6-001 from TOK, Kawasaki shi, Kanagawa (Japan); ARX3001, ARX3340J, AM2073J, and KrFM592Y from JSR Micro, Sunnyvale, Calif.; SAIL-X-181, Shin-Etsu, Tokyo (Japan)) or any other photosensitive compositions. The inventive methods permit the use of much thinner imaging layers. The thickness of the imaging layer is less than about 500 nm, preferably less than about 300 nm, more preferably from about 50 nm to about 200 nm, and even more preferably from about 100 nm to about 180 nm. It will be appreciated that a conventional anti-reflective coating could also be present in the stack between the additional intermediate layer (or carbon-rich layer, if no additional intermediate level is present) and the imaging layer to control reflection during exposure of the imaging layer.

The imaging layer can then be patterned by exposure to light of the appropriate wavelength. More specifically, the imaging layer is exposed using a mask positioned above the imaging layer. The mask has open areas designed to permit radiation (hv) to pass through the mask and contact the imaging layer. The remaining solid portions of the mask are designed to prevent radiation from contacting the imaging layer in certain areas. Those skilled in the art will readily understand that the arrangement of open areas and solid portions is designed based upon the desired pattern to be formed in the imaging layer and ultimately in the substrate. After exposure, the imaging layer is preferably subjected to a post-exposure bake at a temperature of from about 90° C. to about 150° C., more preferably from about 110° C. to about 130° C., for a time period of from about 30 seconds to about 120 seconds.

Upon exposure, the portions of the imaging layer that are exposed to radiation are rendered soluble in aqueous developer. The exposed portions of the imaging layer that were made soluble by the above process are then contacted with an aqueous developer to remove the exposed portions to form the desired pattern in the imaging layer. The pattern can be via holes, trenches, lines, spaces, etc., that will ultimately be transferred to the substrate using an etch or ion implantation process or metal deposition. Alternatively, the exposed portions of the imaging layer can be rendered insoluble during the exposure process, in which case, the removal process is reversed from what is described above. That is, the unexposed portions are removed during development to form the pattern. In either embodiment, at least about 95% of the exposed (or unexposed as the case may be) portions of the imaging layer will preferably be removed by the developer, more preferably at least about 99%, and even more preferably about 100% will be removed. Suitable developers are organic or inorganic alkaline solutions such as KOH or TMAH, and preferably comprise an aqueous solution of TMAH at a concentration of about 0.26N. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

It will also be appreciated that other patterning methods may also be used, including emerging technologies, such as imprint lithography, nano-imprint lithography, hot embossing lithography, and stamping pattern transfer to form the pattern into imaging layer. These technologies use a patterned mold to transfer patterns instead of relying on photolithographic patterning, as described above. Directed self-assembly (DSA) could also be used to pattern the imaging layer.

Regardless of how the pattern is formed in the imaging layer, an etching process is then used to transfer the pattern from the patterned imaging layer into the pattern transfer layer and/or other additional intermediate layer(s), if present. Preferably, RIE is used to transfer the pattern using a reactive ion plasma of $CF_4$, $CHF_3$, $O_2$, HBr, $Cl_2$, $SF_6$, $C_2F_6$, $C_4F_8$, CO, $CO_2$, $N_2$, $H_2$, $C_4H_8$, Ar, $N_2H_2$, He, $CH_2F_2$, or a mixture thereof. Etching breaks through the additional intermediate layer(s) and exposes the developer-soluble, carbon-rich layer. The pattern is then transferred into the carbon-rich layer.

Polyamic Acid Compositions for use in the Invention

The carbon-rich compositions utilized will comprise a polyamic acid dispersed or dissolved in a solvent system. The polyamic acid is preferably present in the composition at a level of from about 1% to about 30% by weight, preferably from about 2% to about 20% by weight, and more preferably from about 5% to about 15% by weight, based upon the total weight of solids in the composition taken as 100% by weight. The weight average molecular weight of the polyamic acid will preferably be less than about 15,000 Daltons, more preferably from about 4,000 Daltons to about 12,000 Daltons, and even more preferably from about 6,000 Daltons to about 11,000 Daltons.

The polyamic acid should be selected to be a highly rigid structure. Ideally, the polyamic acid will have a flat or planar structure with limited spinning possible and a good deal of π bonding. The synthesis of these polyamic acids and suitable developer-soluble compositions comprising these polymers is described in U.S. Pat. Nos. 7,261,997 and 7,364,835, incorporated by reference herein in their entirety. The polyamic acids can be formed by adjusting the dianhydride-to-diamine ratio as well as the dianhydride and diamine types. The dianhydride can be aliphatic or aromatic. Typical aliphatic dianhydrides include those selected from the group consisting of 5-(2,5-dioxotetrahydrol)-3-methyl-3-cyclohexene-1,2-dicarboxylic acid anhydride, cyclobutane tetracarboxylic dianhydride, 1,2,3,4-cyclopentanetetracarboxylic acid dianhydride, tetrahydrofuran-2,3,4,5-tetracarboxylic dianhydride, 4-(2,5-dioxotetrahydrofuran-3-yl)-1,2,3,4-tetrahydronaphthalene-1,2-dicarboxylic anhydride, and bicyclo(2,2,2)oct-7-ene-2,3,5,6-tetracarboxylic dianhydride. Aromatic dianhydrides include those selected from the group consisting of 3,3',4,4'-benzophenone tetracarboxylic acid dianhydride (BTDA), pyromellitic dianhydride (PMDA), 3,3',4,4'-biphenyl tertracarboxylic dianhydride (s-BPDA), 2,2'-bis-(3,4-dicarboxy phenyl)hexafluoropropane dianhydride (6FDA), 4,4'-oxydiphthalic anhydride (OPDA), 3,3',4,4'-diphenylsulfone tetracarboxylic dianhydride (DSDA), 4,4'-bisphenol A dianhydride (BPADA), hydroquinone diphtatic anhydride (HQDA), 3,4,9,10-perylene-tetracarboxylic dianhydride, 1,4,5,8-naphthalenetetracarboxylic dianhydride, and ethylene glycol bis(trimellitic anhydride).

The diamine can also be aliphatic or aromatic. Typical aliphatic diamines include those selected from the group consisting of 1,3-bis(aminomethyl)-cyclohexane, 1,4-bis(aminimethyl)-cyclohexane, 4,4'-methylenebis(cyclohexylamine), and 4,4'-methylene bis(2-methylcyclohexyl)amine. Aromatic diamines include those selected from the group consisting of 3-aminobenzylamine, 1,3-bis(3-aminophenoxy)-benzene, 1,3-bis(4-aminophenoxy)-benzene, 1,4-bis(4-aminophenoxy)benzene, 4,4'-bis(4-aminophenoxy)-biphenyl, 2,2-bis[4-4-aminophenoxy)-phenyl]hexafluproprane, bis[4-(4-aminophenoxy)-phenyl]propane, bis[4-(4-aminophenoxy)-phenyl]sulfone, bis[4-(4-aminophenoxy)-phenyl]sulfone, 1,1'-bis(4-aminophenyl)-clohexane, 9,9'-bis(4-aminophenyl0-fluorene (FDA), 2,2'-bis(4-aminophenyl)-hexafluoropropane, bis(2-aminophenyl) sulfide, bis(4-aminophenyl)sulfide, bis(3-aminophenyl) sulfone, bis(4-aminophenyl)sulfone, 4,4'-diamino-3,3'-dimethyl-diphenylmethane, 3,4'-diaminodiphenyl ether, 4,4'-diaminodiphenyl ether, 3,3'-diaminodiphenyl methane, 3,4'-diaminodiphenyl methane, 2,7-diaminofluorene, 1,5-diaminonaphthalene, 4,4'-diaminooctafluorobiphenyl, 2,5-dimethyl-1,4-phenylenediamine, 4,4'-ethylenedianiline, 1,3-phenylenediamine, 1,4-phenylenediamine, 2,3,5,6-tetramethyl-1,4-phenylenediamine, m-xylylenediamine, and p-xylylenediamine.

Preferred polyamic acids include recurring monomers having the formulas

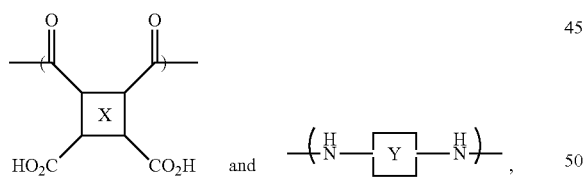

where each of

is individually selected from the group consisting of aliphatic and aryl groups. Particularly preferred X and Y groups include those selected from the group consisting of substituted and unsubstituted phenyl, biphenyl, naphthyl, and anthryl groups, and substituted and unsubstituted $C_1$-$C_{12}$ aliphatic (preferably alkyl) groups.

Particularly preferred polyamic acids for use in the composition comprise recurring monomers selected from the group consisting of

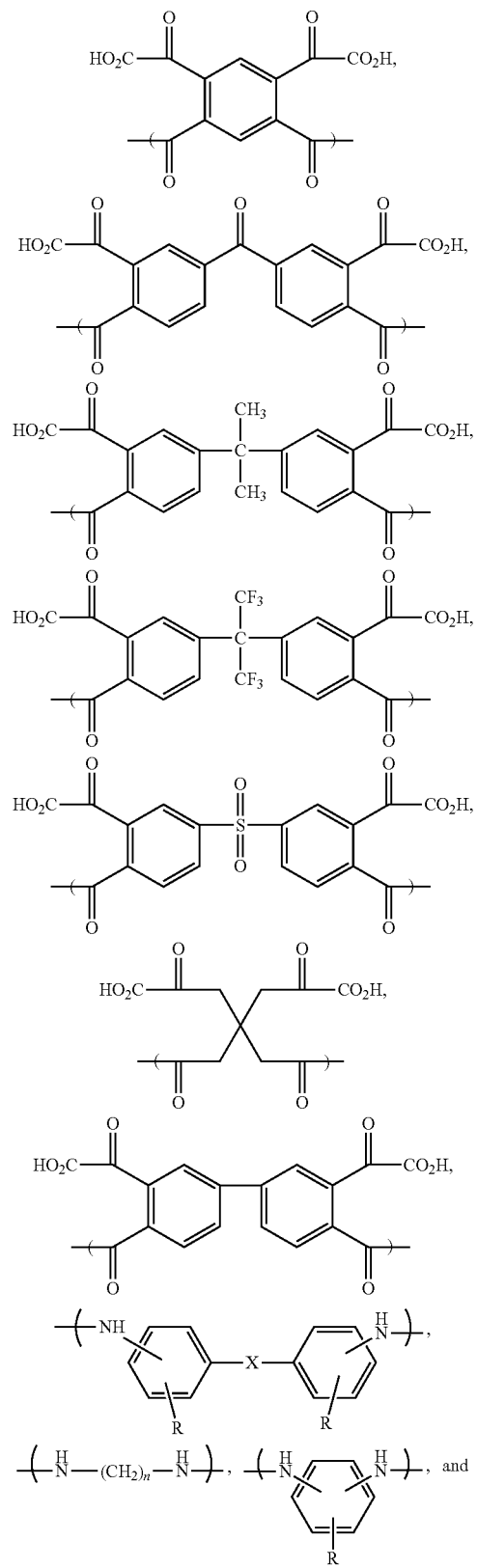

-continued

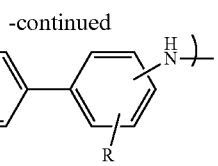

where:
X is selected from the group consisting of —O—, —S—, —CH$_2$—, —C(CF$_3$)$_2$—, and —C(CH$_3$)$_2$—;
n is 2-8; and
each R is individually selected from the group consisting of —H and —OH.

The preferred molar ratio of dianhydrides to diamines is from about 1.8:1 to about 1.05:1, more preferably from about 1.6:1 to about 1.1:1, and even more preferably from about 1.4:1 to about 1.2:1.

The polyamic acid is also selected to be "carbon-rich." The term "carbon-rich polyamic acid" as used herein, refers to polyamic acids having greater than about 50% by weight carbon, preferably greater than about 60% by weight carbon, more preferably greater than about 70% by weight carbon atoms, and even more preferably from about 70% to about 99% by weight carbon, based upon the total weight of the polymer taken as 100% by weight. The preferred polyamic acid will also preferably have a low hydrogen content (e.g., less than about 10% by weight hydrogen, preferably less than about 5% by weight hydrogen, more preferably less than about 3% by weight hydrogen, and even more preferably from about 0.01% to about 2% by weight hydrogen, based upon the total weight of the polymer taken as 100% by weight).

The carbon-rich compositions used in the invention also preferably include a crosslinking agent that will react with the carboxylic acid and/or the secondary amine. Epoxy crosslinking agents, vinyl ether crosslinking agents, and amino crosslinking agents are particularly preferred. Epoxy crosslinking agents include small molecules with multiple epoxy groups such as those selected from the group consisting of N,N,N',N'-tetraglycidyl-4,4'-methylenebisbenzenamine, 4-glycidyloxy-N,N'-diglycidylaniline and bis(3,4-epoxy cyclo hexyl methyl) adipate, and polymers with epoxy groups, such as epoxy cresol novolac or polymers prepared from methylacrylate or acrylates with epoxy groups as side chains. Vinyl ether crosslinkers include multi functional vinyl ethers, such as those selected from the group consisting of 1,3,5-benzenetricarboxylic acid tris[4-(ethenyloxy)butyl]ester, bis[4-(vinyloxy)butyl]isophthalate, bis[4-(vinyloxy)butyl]1,6-hexanediylbiscarbamate, bis[4-(vinyloxymethyl)cyclohexylmethyl]glutarate, bis[4-(vinyloxy)butyl]succinate, tri(ethylene glycol)divinyl ether, and poly(ethylene glycol) divinyl ether. Amino resin crosslinkers include those selected from the group consisting of melamine crosslinkers, urea crosslinkers, benzoguanamine crosslinkers, and glycoluril crosslinkers.

The crosslinking agent is preferably present in the composition at a level of from about 0.1% to about 30% by weight, preferably from about 0.5% to about 25% by weight, and more preferably from about 1% to about 20% by weight, based upon the total weight of solids in the composition taken as 100% by weight.

A number of optional ingredients can also be included in the composition (e.g., catalysts, surfactants). Optional catalysts may include, but are not limited to, acids, such as 5-sulfosalicylic acid, thermally generated acid (TAG), photo generated acid (PAG), or base. Suitable surfactants include both ionic or nonionic surfactants.

Regardless of the embodiment, the compositions are formed by simply dispersing or dissolving the polyamic acid in a suitable solvent system, preferably at ambient conditions and for a sufficient amount of time to form a substantially homogeneous dispersion. The other ingredients (e.g., crosslinker, any catalysts and/or surfactants) are preferably dispersed or dissolved in the solvent system along with the compound.

Preferred solvent systems include a solvent selected from the group consisting of PGMEA, PGME, propylene glycol n-propyl ether (PnP), ethyl lactate, cyclohexanone, gamma butyrolactone (GBL), and mixtures thereof. The solvent system should be utilized at a level of from about 80-99% by weight, and preferably from about 95-99% by weight, based upon the total weight of the composition taken as 100% by weight. Thus, the compositions typically have a solids content of from about 1-20% by weight, and preferably from about 1-5% by weight, based upon the total weight of the composition taken as 100% by weight.

The resulting polyamic acid compositions will be carbon-rich. "Carbon-rich compositions" as used herein refers to compositions comprising greater than about 50% by weight carbon, preferably greater than about 60% by weight carbon, more preferably greater than about 70% by weight carbon, and even more preferably from about 70% to about 99% by weight carbon, based upon the total solids in the composition taken as 100% by weight. These polyamic acid compositions will also preferably have a low hydrogen content (e.g., less than about 10% by weight hydrogen, preferably less than about 5% by weight hydrogen, more preferably less than about 3% by weight hydrogen, and even more preferably from about 0.01% to about 2% by weight hydrogen, based upon the total solids in the composition taken as 100% by weight).

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of Polymer A

In this Example, 16.99 grams (0.0643 mole) of 5-(2,5'-dioxotetrahydrol)-3-methyl-3-cyclohexene-1,2-dicarboxylic anhydride (CHRISKEV, Inc., Lenexa, Kans.), 14.00 grams (0.0402 mole) of 4,4'-(9-fluorenylidene)dianiline (CHRISKEV, Inc., Lenexa, Kans.), and 123.95 grams of propylene glycol monomethyl ether ("PGME," Ultra Pure Solutions, Inc., Castroville, Calif.) were added to a two-necked round flask. The contents of the flask were stirred under nitrogen and, while stirring was maintained, heated at 60° C. for 24 hours to complete the reaction. The mixture was allowed to cool to room temperature and was bottled. Solids content was 20% by weight. The reaction scheme of this Example is shown below.

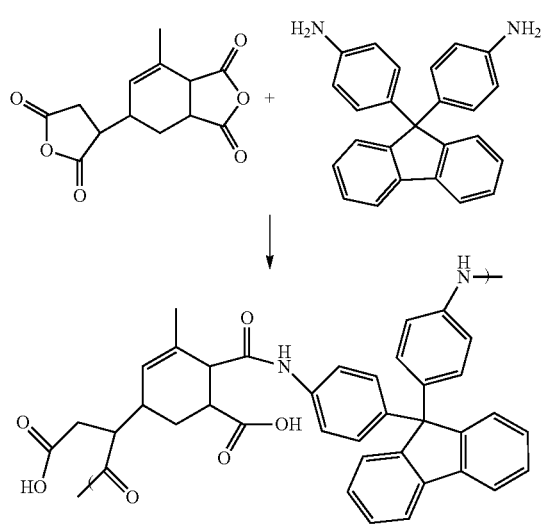

Example 2

SOC Formulation A-1

An SOC formulation was prepared by mixing 5.01 grams of Polymer A from Example 1 with 0.114 gram of a 50% by weight solution of MY-720 (Huntsman Advanced Materials, Woodlands, Tex.) in PGME, 22.04 grams of PGME, and 2.92 grams of cyclohexanone to make a solution having a solids content of 3.5% by weight. The solution was mixed well for 4 hours and was filtered through a PTFE filter having a pore size of 0.1 μm. The formulation was spin-coated onto a 4-inch silicon wafer at 1,500 rpm for 60 seconds and then was baked on a hot plate at 225° C. for 60 seconds. The resulting cured film was measured by ellipsometry to be 1317 Å thick and could not be removed by PGME or propylene glycol methyl ether acetate ("PGMEA").

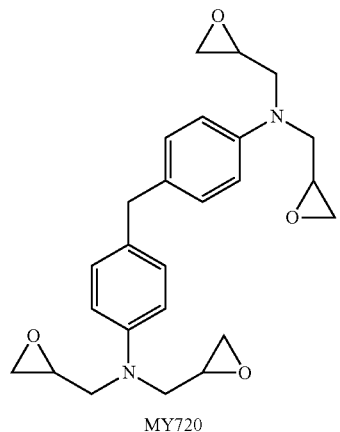

MY720

Example 3

SOC Formulation A-2

An SOC formulation was prepared by mixing 5.01 grams of Polymer A from Example 1 with 0.206 gram of a 50% by weight solution of MY-720 in PGME, 23.25 grams of PGME, and 3.07 grams of cyclohexanone to make a solution having a solids content of 3.5% by weight. The solution was mixed well for 4 hours and then was filtered through a PTFE filter having a pore size of 0.1 μm. The formulation was spin-coated onto a 4-inch silicon wafer at 1,500 rpm for 60 seconds, and then was baked on a hot plate at 205° C. for 60 seconds. The resulting cured film was measured by ellipsometry to be 1,378 Å thick and could not be removed by PGME or PGMEA.

Example 4

Synthesis of Polymer B

In this Example, 15.92 grams (0.0603 mole) of 5-(2,5'-dioxotetrahydrol)-3-methyl-3-cyclohexene-1,2-dicarboxylic anhydride, 15.00 grams (0.043 mole) of 4,4'-(9-fluorenylidene)dianiline, and 123.95 grams of PGME (Ultra Pure Solutions, Inc., Castroville, Calif.) were added to a two-necked round flask. The contents were stirred under nitrogen and, while stirring was maintained, heated at 60° C. for 24 hours to complete the reaction. The mixture was allowed to cool to room temperature and was bottled. The solids content was 20% by weight. The reaction scheme is the same as that shown in Example 1.

Example 5

SOC Formulation B-1

An SOC formulation was prepared by mixing 5.01 grams of Polymer B from Example 4 with 0.101 gram of a 50% by weight solution of MY-720 in PGME, 22.03 grams of PGME, and 2.92 grams of cyclohexanone to make a solution having a solids content of 3.5% by weight. The solution was mixed well for 4 hours and was filtered through a PTFE filter having a pore size of 0.1 μm. The formulation was spin-coated onto a 4-inch silicon wafer at 1,500 rpm for 60 seconds and then was baked on a hot plate at 205° C. for 60 seconds. The resulting cured film was measured by ellipsometry to be 1423 Å thick and was unable to be removed by PGME and PGMEA.

Example 6

SOC Formulation B-2

An SOC formulation was prepared by mixing 5.02 grams of Polymer B from Example 4 with 0.202 gram of a 50% by weight solution of MY-720 in PGME, 23.22 grams of PGME, and 3.03 grams of cyclohexanone to make a solution having a solids content of 3.5% by weight. The solution was mixed well for 4 hours and was filtered through a PTFE filter having a pore size of 0.1 μm. The formulation was spin-coated onto a 4-inch silicon wafer at 1,500 rpm for 60 seconds and then was baked on a hot plate at 205° C. for 60 seconds. The resulting cured film was measured by ellipsometry to be 1,422 Å thick and could not be removed by PGME and PGMEA.

Example 7

Synthesis of Polymer C

In this Example, 20.40 grams (0.0459 mole) of 4,4'-(hexafluoroisopropylidene)diphthalic anhydride (CHRISKEV, Inc., Lenexa, Kans.), 10.00 grams (0.0287 mole) of 4,4'-(9-fluorenylidene)dianiline, and 121.70 grams of PGME were added to a two-necked round flask. The contents of the flask were stirred under nitrogen and, while stirring was maintained, heated to 60° C. for 20 hours to complete the reaction. The mixture was allowed to cool to room temperature and was bottled. The solids content was 20% by weight. The reaction scheme is the same as that shown in Example 1.

Example 8

SOC Formulation C-1

An SOC formulation was prepared by mixing 9.08 grams of Polymer C from Example 7 with 0.36 gram of a 50% by weight solution of MY-720 in PGME, 35.75 grams of PGME, and 7.80 grams of cyclohexanone to make a solution having a solids content of 3.5% by weight. The solution was mixed well for 4 hours and was filtered through a PTFE filter having a pore size of 0.1 μm. The formulation was spin-coated onto a 4-inch silicon wafer at 1,500 rpm for 60 seconds and then was baked on a hot plate at 205° C. for 60 seconds. The resulting cured film was measured by ellipsometry to be 1,578 Å thick and could not be removed by PGME and PGMEA.

Example 9

Synthesis of Polymer D

In this Example, 16.99 grams (0.0643 mole) of 5-(2,5'-dioxotetrahydrol)-3-methyl-3-cyclohexene-1,2-dicarboxylic anhydride, 14.0 grams (0.0402 mole) of 4,4'-(9-fluorenylidene)dianiline, and 99.2 grams of PGME and 24.8 grams of cyclohexanone (Ultra Pure Solutions, Inc., Castroville, Calif.) were added to a two-necked round flask. The contents of the flask were stirred under nitrogen and, while stirring was maintained, heated at 60° C. for 24 hours to complete the reaction. The mixture was allowed to cool to room temperature and was bottled. Solids content was about 20% by weight. The reaction scheme is the same as that shown in Example 1.

Example 10

SOC Formulation D-1

An SOC formulation was prepared by mixing 5.01 grams of Polymer D from Example 9 with 0.15 gram of a 50% by weight solution of MY-721 (Huntsman Advanced Materials, Woodlands, Tex.) in PGME, and 15.5 grams of PGME. The solution was mixed well for 4 hours and was filtered through a PTFE filter having a pore size of 0.1 μm. The formulation was spin-coated onto a 4-inch silicon wafer for 60 seconds and then was baked on a hot plate at 205° C. for 60 seconds.

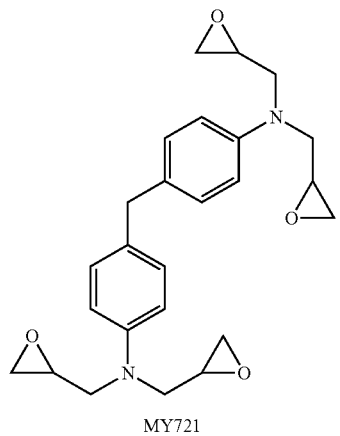

MY721

Example 11

Synthesis of Polymer E

In this Example, 15.9 grams (0.0609 mole) of 5-(2,5'-dioxotetrahydrol)-3-methyl-3-cyclohexene-1,2-dicarboxylic anhydride, 15.00 grams (0.0430 mole) of 4,4'-(9-fluorenylidene)dianiline, 98.8 grams of PGME, 24.8 grams cyclohexanone were added to a two-necked round flask. The contents of the flask were stirred under nitrogen and, while stirring was maintained, heated at 60° C. for 24 hours to complete the reaction. The mixture was allowed to cool to room temperature and was bottled. Solids content was about 20% by weight. The reaction scheme is the same as that shown in Example 1.

Example 12

SOC Formulation E-1

An SOC formulation was prepared by mixing 5.01 grams of Polymer E from Example 11 with 0,15 gram of a 50% by weight solution of MY-721 in PGME and 15.5 grams of PGME. The solution was mixed well for 4 hours and was filtered through a PTFE filter having a pore size of 0.1 μm. The formulation was spin-coated onto a 4-inch silicon wafer for 60 seconds and then was baked on a hot plate at 205° C. for 60 seconds.

Example 13

SOC Formulation E-2

An SOC formulation was prepared by mixing 5.01 grams of Polymer E from Example 11 with 0.20 gram 1,3,5-benzenetricarboxylic acid tris[4-(ethenyloxy)butyl]ester crosslinker (structure shown below, Brewer Science Inc., Rolla, Mo.) and 15.5 grams of PGME. The solution was mixed well for 4 hours and was filtered through a PTFE filter having a pore size of 0.1 μm. The formulation was spin-coated onto a 4-inch silicon wafer for 60 seconds and then was baked on a hot plate at 225° C. for 60 seconds.

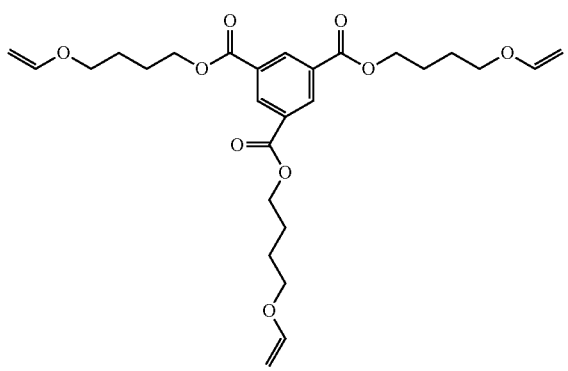 [SMILES: C=COCCCCOC(=O)c1cc(C(=O)OCCCCOC=C)cc(C(=O)OCCCCOC=C)c1]

Example 14

SOC Formulation E-3

An SOC formulation was prepared by mixing 5.01 grams of Polymer E from Example 11 with 0.20 gram Cymel 1174 crosslinker (structure shown below, Cytech Industries, Woodland Park, N.J.), 0.01 g TAG 2689 (thermal acid generator from King Industries, Norwalk, Conn.) in PGME, and 15.5 grams of PGME. The solution was mixed well for 4 hours and was filtered through a PTFE filter having a pore size of 0.1 μm. The formulation was spin-coated onto a 4-inch silicon wafer for 60 seconds and then baked on a hot plate at 205° C. for 60 seconds.

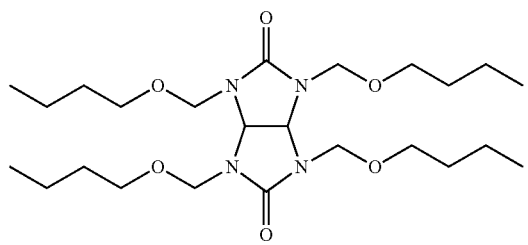 [SMILES: CCCCOCN1C(=O)N(COCCCC)C2C1N(COCCCC)C(=O)N2COCCCC]

Example 15

Synthesis of Polymer F

In this procedure, 14.57 grams (0.0551 mole) of 5-(2,5'-dioxotetrahydrol)-3-methyl-3-cyclohexene-1,2-dicarboxylic anhydride. 15.00 grams (0.0459 mole) of 4,4'-(9-fluorenylidene)dianiline, 98.8 grams of PGME, and 24.8 grams cyclohexanone were added to a two-necked round flask. The contents of the flask were stirred under nitrogen and, while stirring was maintained, were heated at 60° C. for 24 hours to complete the reaction. The mixture was allowed to cool to room temperature and was bottled. Solids content was about 20% by weight. The reaction scheme is the same as that shown in Example 1.

Example 16

SOC Formulation F-1

An SOC formulation was prepared by mixing 5.01 grams of Polymer F from Example 15 with 0.15 gram of a 50% by weight solution of MY-721 in PGME and 15.5 grams of PGME. The solution was mixed well for 4 hours and was filtered through a PTFE filter having a pore size of 0.1 μm. The formulation was spin-coated onto a 4-inch silicon wafer for 60 seconds and then was baked on a hot plate at 205° C. for 60 seconds.

Example 17

Synthesis of Polymer G

In this procedure, 15.9 grams (0.0609 mole) of 5-(2,5'-dioxotetrahydrol)-3-methyl-3-cyclohexene-1,2-dicarboxylic anhydride, 15.00 grams (0.0430 mole) of 4,4'-(9-fluorenylidene)dianiline, 24.8 grams of PGME, and 98.8 grams cyclohexanone were added to a two-necked round flask. The contents of the flask were stirred under nitrogen and, while stirring was maintained, were heated at 60° C. for 24 hours to complete the reaction. The mixture was allowed to cool to room temperature and was bottled. Solids content was about 20% by weight. The reaction scheme is the same as that shown in Example 1.

Example 18

Synthesis of Polymer H

In this procedure, 19.6 grams (0.0441 mole) of 4,4'-(hexafluoroisopropylidene)diphthalic anhydride (CHRISKEV, Inc., Lenexa, Kans.), 11.00 grams (0.0315 mole) of 4,4'-(9-fluorenylidene)dianiline, 85.79 grams of PGME, and 36.75 grams of cyclohexanone were added to a two-necked round flask. The contents of the flask were stirred under nitrogen and, while stirring was maintained, were heated to 80° C. for 20 hours to complete the reaction. The mixture was allowed to cool to room temperature and was bottled. The solids content was 20% by weight. The reaction scheme is shown below.

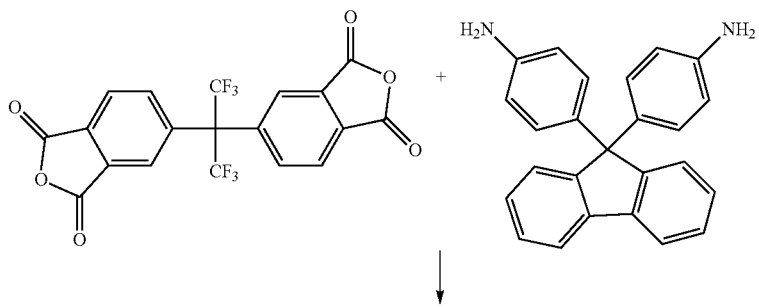

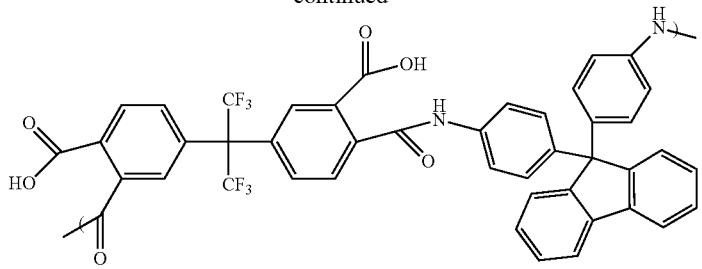

Example 19

SOC Formulation H-1

An SOC formulation was prepared by mixing 5.01 grams of Polymer H from Example 18 with 0.05 gram of a 50% by weight solution of MY-721 (Huntsman Advanced Materials) in PGME, and 15.5 grams of PGME. The solution was mixed well for 4 hours and was filtered through a PTFE filter having a pore size of 0.1 μm. The formulation was spin-coated onto a 4 inch silicon wafer for 60 seconds and then was baked on a hot plate at 350 ° C. for 60 seconds. The highly thermal stable carbon layer formed according to the scheme shown below.

Example 20

Synthesis of Polymer I

In this Example, 19.6 grams (0.0441 mole) of 4,4'-(hexafluoroisopropylidene)diphthalic anhydride, 11.00 grams (0.0315 mole) of 4,4'-(9-fluorenylidene)dianiline, and 121.70 grams of gamma-butyrolactone (GBL) were added to a two-necked round flask. The contents of the flask were stirred under nitrogen and, while stirring was maintained, were heated to 80° C. for 20 hours to complete the reaction. The mixture was allowed to cool to room temperature and was bottled. The solids content was 20% by weight. The reaction scheme is the same as that shown in Example 18.

Example 21

Synthesis of Polymer J

In this Example, 11.3 grams (0.0351 mole) of 3,3,4,4'-benzophenone tetracarboxylic dianhydride (CHRISKEV, Inc., Lenexa, Kans.), 8.71 grams (0.0251 mole) of 4,4'-(9-fluorenylidene)dianiline, 56.0 grams of PGME, and 24.0 grams of cyclohexanone were added to a two-necked round flask. The contents of the flask were stirred under nitrogen and, while stirring was maintained, heated to 80° C. for 20 hours to complete the reaction. The mixture was allowed to cool to room temperature and was bottled. The solids content was 20% by weight. The reaction scheme is shown below.

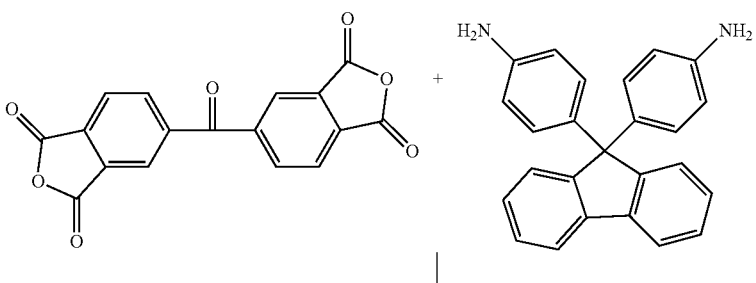

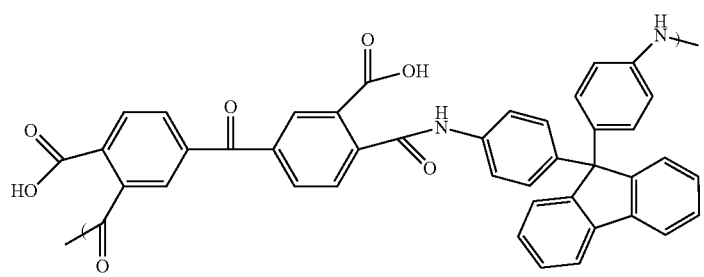

Example 22

SOC Formulation J-1

An SOC formulation was prepared by mixing 5.01 grams of Polymer J from Example 21 with 0.15 gram of a 50% by weight solution of MY-721 in PGME and 15.5 grams of PGME. The solution was mixed well for 4 hours and was filtered through a PTFE filter having a pore size of 0.1 µm. The formulation was spin-coated onto a 4-inch silicon wafer at 1,500 rpm for 60 seconds and then was baked on a hot plate at 205° C. for 60 seconds.

Example 23

Synthesis of Polymer K

In this procedure, 7.93 grams (0.0363 mole) of pyromelitic dianhydride (CHRISKEV, Inc., Lenexa, Kans.), 12.07 grams (0.0260 mole) of 4,4'-(9-fluorenylidene)dianiline, 56.0 grams of PGME, and 24.0 grams of cyclohexanone were added to a two-necked round flask. The contents of the flask were stirred under nitrogen and, while stirring was maintained, heated to 80° C. for 20 hours to complete the reaction. The mixture was allowed to cool to room temperature and was bottled. The solids content was 20% by weight. The reaction scheme is shown below.

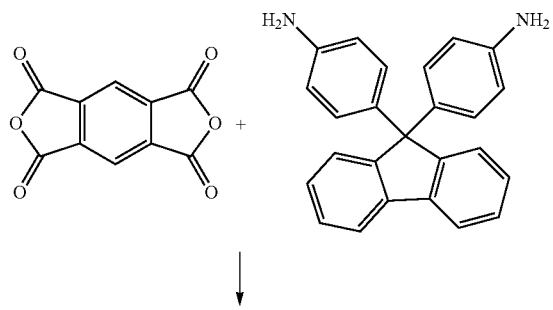

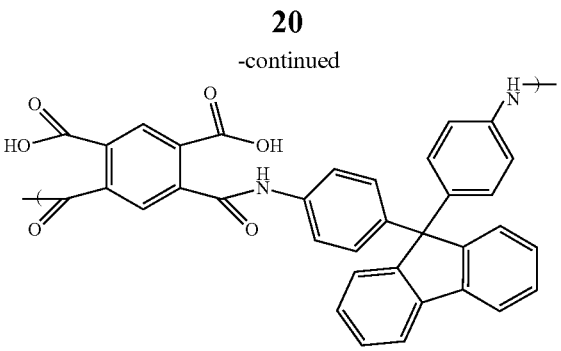

Example 24

SOC Formulation K-1

An SOC formulation was prepared by mixing 5.01 grams of Polymer K from Example 23 with 0.15 gram of a 50% by weight solution of MY-721 in PGME and 15.5 grams of PGME. The solution was mixed well for 4 hours and was filtered through a PTFE filter having a pore size of 0.1 µm. The formulation was spin-coated onto a 4-inch silicon wafer at 1500 rpm for 60 seconds and then was baked on a hot plate at 205° C. for 60 seconds.

Example 25

Characterization of SOC Formulations

The optical constants (n and k) and film thickness were measured by M2000 Ellipsometer (J. A. Woollam, Lincoln, Nebr.). For the solvent resistance test, the coated wafer was puddled with the solvent for 20 seconds and spin-dried. The thickness before and after solvent contact was compared, and the results are listed in Table 1. For the reworking test, the coated wafer was immersed in the developer PD523AD (Moses Chemicals Inc., Moses Lake, Wash.) at different temperatures for five minutes, and then rinsed by deionized water.

TABLE 1

| | | Example 2 (SOC Formulation A-1) | Example 3 (SOC Formulation A-2) | Example 5 (SOC Formulation B-1) | Example 6 (SOC Formulation B-2) | Example 8 (SOC Formulation C-1) | Example 10 (SOC Formulation D-1) | Example 12 (SOC Formulation E-1) | Example 13 (SOC Formulation E-2) | Example 14 (SOC Formulation E-3) | Example 16 (SOC Formulation F-1) | Example 22 (SOC Formulation J-1) | Example 24 (SOC Formulation K-1) |
|---|---|---|---|---|---|---|---|---|---|---|---|---|---|
| Optical Constants | $n_{193\,nm}$ | 1.56 | 1.55 | 1.55 | 1.56 | | 1.56 | 1.55 | 1.55 | 1.56 | 1.56 | | |
| | $k_{193\,nm}$ | 0.45 | 0.46 | 0.46 | 0.44 | | 0.45 | 0.46 | 0.46 | 0.44 | 0.44 | | |
| | $n_{633\,nm}$ | 1.61 | 1.62 | 1.62 | 1.61 | | 1.61 | 1.62 | 1.62 | 1.61 | 1.61 | | |
| | $k_{633\,nm}$ | 0.00 | 0.00 | 0.00 | 0.00 | | 0.00 | 0.00 | 0.00 | 0.00 | 0.00 | | |
| Stripping Loss | Loss in PGME | 0.0% | 0.08% | 25% | 0.08% | 0.3% | 0.0% | 0.00% | 0.0% | 0.0% | 0.0% | 0.0% | 0.0% |
| | Loss in PGMEA | 0.0% | 0.0% | 0.0% | 0.0% | 0.0% | 0.0% | 0.0% | 0.0% | 0.0% | 0.0% | 0.0% | 0.0% |
| Rework | Rework at room temp. | Clean | Residue | NA | Residue | No | Clean | Clean | No | Clean | No | Clean | Clean |
| | Rework at 60° C. | Residue | Residue | Residue | Residue | Clean | | | Clean | | Clean | | |

Example 26

Positive-Tone Development Lithography

A lithography test was performed using the following multilayer stack (from top to bottom): AIM54B4 (JSR Micro. Inc., Sunnyvale, Calif.) photoresist, OptiStack® HM9825 (Brewer Science Inc., Rolla, Mo.) hardmask, and SOC Formulation E-2 (Example 13) as the carbon layer. The coated wafer was exposed using a 1900i stepper (ASML, Veldhoven, Netherlands) and developed by an aqueous basic solution, OPD5262 (FujiFilm, North Kingstown, R.I.) to remove the exposed section. FIG. 1 demonstrates the lithography results.

Example 27

Negative-Tone Development Lithography

Figure 2:
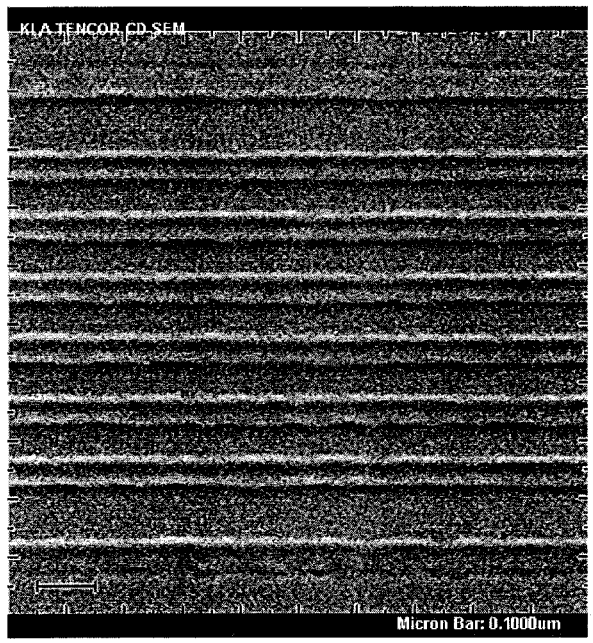
FIG. 2 is an SEM photograph of the negative-tone development photolithography (53S/105P, 19.6 mJ) carried out in Example 27.

A lithography test was performed using the following stacking from the top to bottom: FAIRS9521-V10K (FujiFilm, North Kingstown, R.I.) photoresist; an experimental hardmask from Brewer Science Inc., Rolla, Mo.; and SOC Formulation E-2 (Example 13) as the carbon layer. The coated wafer was exposed using a 1900i stepper and developed using an organic developer, FN-DP001 (FujiFilm, North Kingstown, R.I.), to remove unexposed section. FIG. 2 demonstrates the lithography results.

Example 28

Pattern Transfer to SOC Layer

Figure 3:
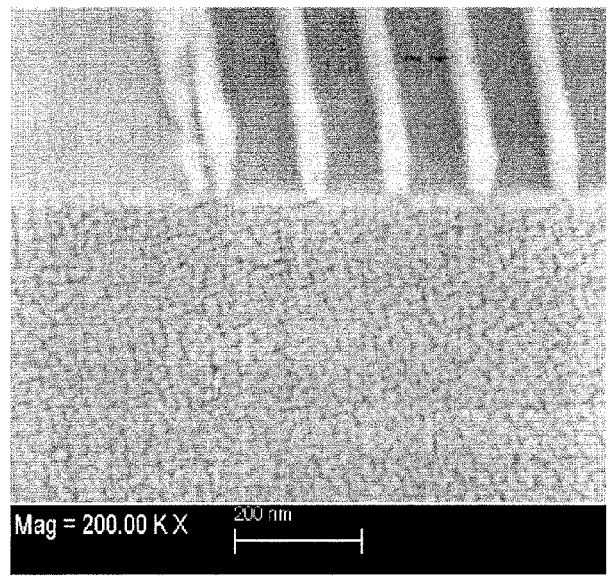
FIG. 3 is an SEM photograph of the etched, spin-on carbon layer formed in Example 28.

The wafer from Example 26 was cut into chips and then loaded at Oxford Plasmalab RIE for etching at following conditions: $CF_4$, 35 sccm, 55 s, 50 mTorr, 100 W, followed by $Ar/CO_2$, 25/25 sccm, 70 s, 20 mTorr, 300 W. The SEM photograph (FIG. 3) demonstrated that the pattern of the photoresist was transferred to the SOC layer successfully.

Example 29

Thermal Stability of the SOC

Figure 4:
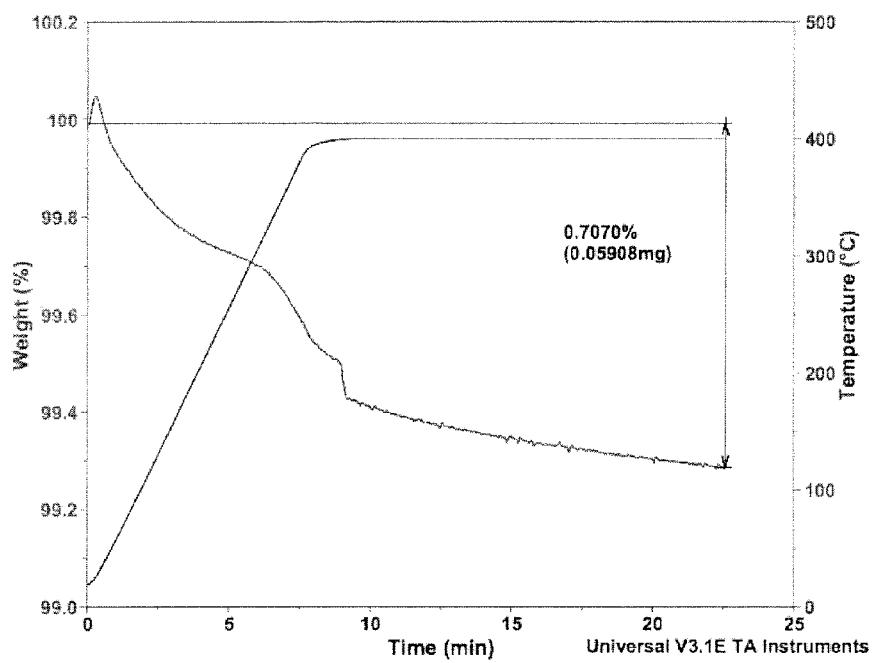
FIG. 4 shows the thermogravimetric analysis ("TGA") curve of SOC formulation E-2 from Example 29.

A film of Formulation E-2 (Example 13) was formed on a wafer and then was peeled from wafer and loaded into a TGA pan. The sample was heated to 400° C. at a speed of 20° C./min, and held for 10 minutes. FIG. 4 shows the curve of weight loss vs. time, which indicated that material exhibited an extremely high thermal stability at that temperature, similar to the temperatures at which CVD processes are carried out to deposit hardmasks on the SOC layer.

Example 30

Gap Filling

Figure 5:
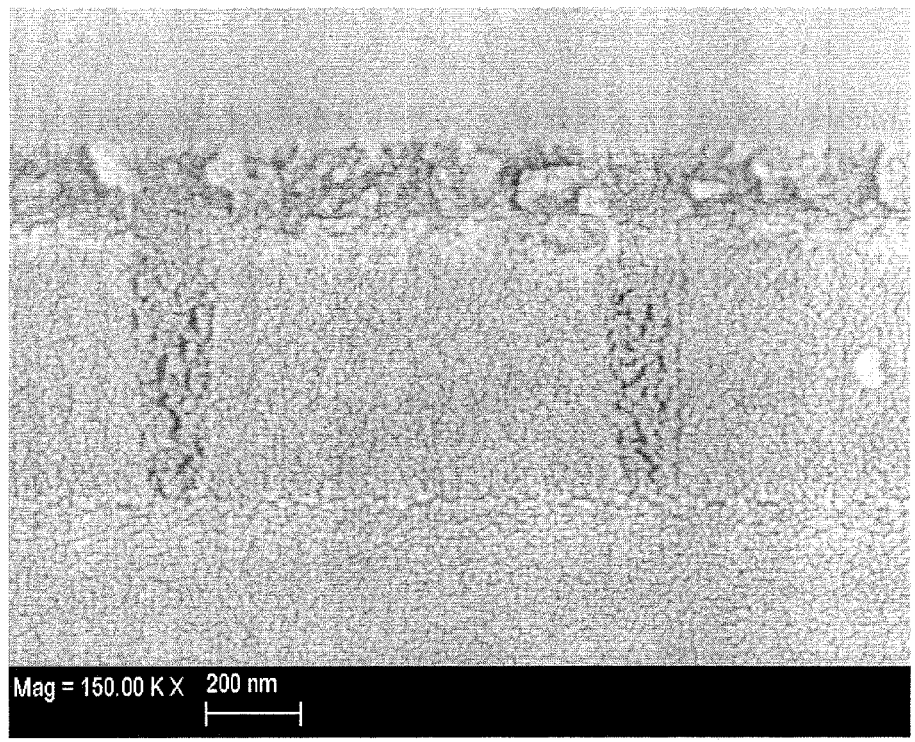
FIG. 5 is an SEM photograph of SOC formulation E-2 filling isolated deep contact hole, as described in Example 30.
Figure 6:
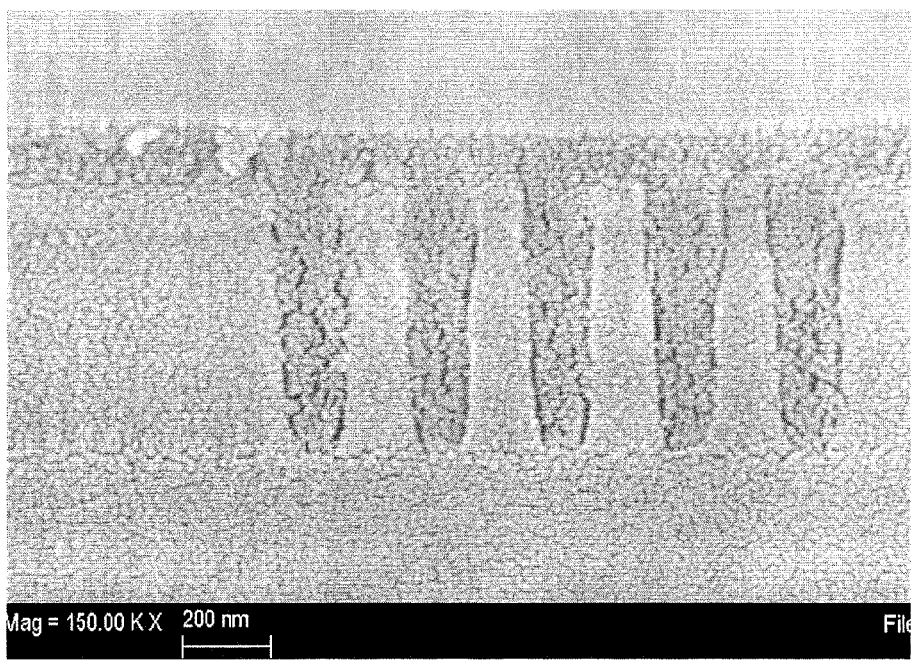
FIG. 6 is an SEM photograph of SOC formulation E-2 filling dense deep contact hole, as described in Example 30.

SOC Formulations E-2 (Example 13) and E-3 (Example 14) were spin-coated on chips cut from Topowafer (SEMATECH, Albany, N.Y.) and baked at 225° C. SEM pictures (FIGS. 5 and 6) demonstrate that deep contact holes (dense or isolated) are filled very well without any defects.

Example 31

Sublimation Testing

Quartz crystal microbalance (QCM) was used to determined the sublimation of samples. In this method, a quartz crystal is suspended over a hot place, where it can collect the outgassed material from heated wafer. A ventilation line is attached at the top to draw air flow upwards and allow the outgassed material to condense on the surface of the quartz crystal. The condensate is collected on the crystal, and the change in resonant frequency is correlated to mass units of the condensate. The standard process includes a 4-inch silicon wafer coated with an organic spin-on coating. The wafer was placed under the QCM on a hot place for 120 seconds. The data are collected.

OptiStack® SOC110D (Brewer Science, Rolla, Mo.), Formulation E-1 (Example 12), and Formulation E-2 (Example 13) were spin-coated on a 4-inch silicon wafer and baked. The sublimation was collected for 120 seconds. The data are listed in Table 2, which demonstrated that the formulation exhibited comparable sublimation to current standard products, even when the baking temperature was higher.

TABLE 2

| Sample | Bake Temperature | Sublimation (ng) |
| --- | --- | --- |
| OptiStack ® SOC110D | 205° C. | 1231 |
| Formulation E-1 | 205° C. | 385 |
| Formulation E-2 | 225° C. | 1392 |

Example 32

Pattern Transfer to Silicon Substrate and Wiggling Resistance (Test 1)

Figure 7:
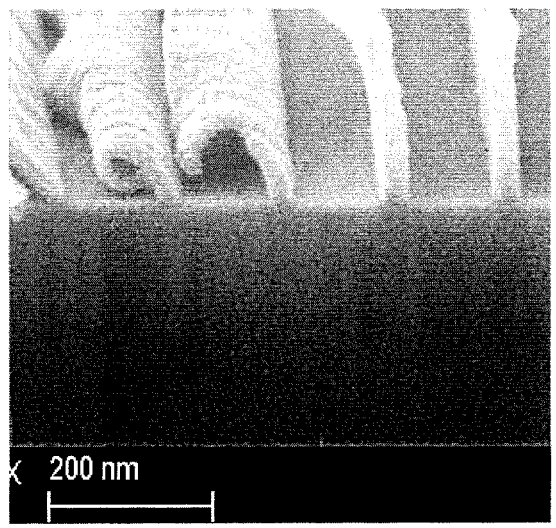
FIG. 7 is an SEM photograph showing an OptiStack® SOC110D pattern after $C_4F_8$/Ar etching, as described in Example 32.

A lithography test was performed using the following multilayer stack (from top to bottom): AIM54B4 photoresist, OptiStack® HM825 hardmask, and OptiStack® SOC110D as the carbon layer. The coated wafer was exposed using a 1900i stepper and developed by OPD5262 to remove the exposed section. The wafer was cut into chips and then loaded into an Oxford Plasmalab RIE for etching at following conditions: $CF_4$, 35 sccm, 55 s, 50 mTorr, 100 W, followed by $Ar/CO_2$, 25/25 sccm, 70 s, 20 mTorr, 300 W, and then $C_4F_8/Ar$, 5/100 sccm, 70 s, 20 mTorr, 300 W. FIG. 7 shows that the pattern of SOC layer wiggled during $C_4F_8/Ar$ etching, and there was no good pattern transfer to silicon substrate.

Example 33

Pattern Transfer to Silicon Substrate and Wiggling Resistance (Test 2)

Figure 8:
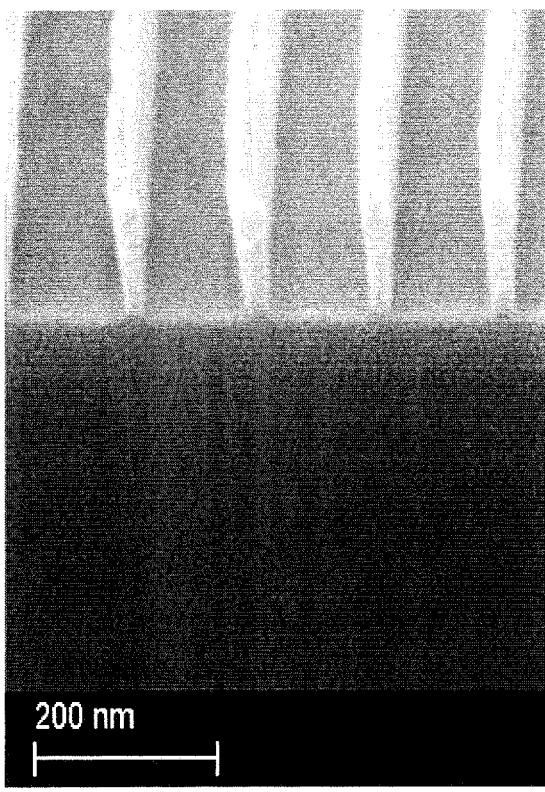
FIG. 8 is an SEM photograph showing the pattern of Formulation E-2 after $C_4F_8$/Ar etching, as described in Example 33.

The wafer from Example 26 was cut into chips and then loaded into an Oxford Plasmalab RIE for etching at following conditions: $CF_4$, 35 sccm, 55 s, 50 mTorr, 100 W, followed by $Ar/CO_2$, 25/25 sccm, 70 s, 20 mTorr, 300 W, and the $C_4F_8/Ar$, 5/100 sccm, 70 s, 20 mTorr, 300 W. FIG. 8 shows that the SOC pattern did not wiggle, which exhibited better wiggling resistance than current standard materials (Example 32). The pattern was transferred to the silicon substrate successfully.

We claim:

1. A method of forming a microelectronic structure, said method comprising:
   providing a substrate having a surface;
   optionally forming one or more intermediate layers on said substrate surface, there being an uppermost intermediate layer on said substrate surface, if one or more intermediate layers are present;
   applying a composition to said uppermost intermediate layer, if present, or to said substrate surface, if no intermediate layers are present, said composition comprising a polyamic acid dissolved or dispersed in a solvent system, wherein said polyamic acid includes recurring monomers having the formulas

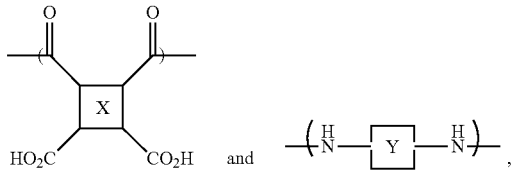

where each of

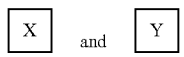

is individually selected from the group consisting of aliphatic and aryl groups;

heating said composition to form a carbon-rich layer, said carbon-rich layer being developer soluble, and exhibiting a weight loss of less than about 10% at a temperature of about 400° C. for about 10 minutes.

2. The method of claim 1, there being at least one intermediate layer on said substrate surface.

3. The method of claim 1, further comprising forming an imaging layer on said carbon-rich layer.

4. The method of claim 1, further comprising forming at least one additional intermediate layer on said carbon-rich layer.

5. The method of claim 4, further comprising forming an imaging layer on said at least one additional intermediate layer.

6. The method of claim 1, wherein said composition comprises greater than about 50% by weight carbon, based upon the weight of the solids in the composition taken as 100% by weight.

7. The method of claim 1, wherein said composition comprises less than about 10% by weight hydrogen, based upon the total weight of the total solids in the composition taken as 100% by weight.

8. The method of claim 1, wherein said carbon-rich layer comprises greater than about 50% by weight carbon, based upon the weight of the layer taken as 100% by weight.

9. The method of claim 1, wherein said carbon-rich layer comprises less than about 10% by weight hydrogen, based upon the total weight of the layer taken as 100% by weight.

10. The method of claim 1, wherein said polyamic acid is a copolymer of a dianhydride and a diamine, wherein:

said dianhydride is selected from the group consisting of 5-(2,5-dioxotetrahydrol)-3-methyl-3-cyclohexene-1,2-dicarboxylic acid anhydride, cyclobutane tetracarboxylic dianhydride, 1,2,3,4-cyclopentanetetracarboxylic acid dianhydride, tetrahydrofuran-2,3,4,5-tetracarboxylic dianhydridc, 4-(2,5-dioxotetrahydrofuran-3-yl)-1 2,3,4-tetrahydronaphthalene-1,2-dicarboxylic anhydride, bicyclo (2,2,2) oct-7-ene-2,3,5,6-tetracarboxylic dianhydride, 3,3',4,4'-benzophenone tetracarboxylic acid dianhydride, pyromellitic dianhydride, 3,3',4,4'-biphenyl tertracarboxylic dianhydride, 2,2-bis-(3,4-dicarboxy phenyl) hexafluoropropane dianhydride, 4,4'-oxydiphthalic anhydride, 3,3',4,4'-diphenylsulfone tetracarboxylic dianhydride,4,4'-bisphenol A dianhydride, hydroquinone diphtatic anhydride, 3,4,9,10-perylene-tetracarboxylic dianhydride, 1,4,5,8-naphthalenetetracarboxylic dianhydride, and ethylene glycol bis (trimellitic anhydride); and said diamine is selected from the group consisting of 1,3-bis(aminomethyl)-cyclohexane, 1,4-bis(aminimethyl)-cyclohexane, 4,4'-methylenebis(cyclohexylamine), 4,4'-methylene bis(2-methylcyclohexyl)amine, 3 -aminobenzylamine, 1,3-bis(3-aminophenoxy)-benzene, 1,3-bis(4-aminophenoxy)-benzene, 1,4-bis(4-aminophenoxy)benzene, 4,4'-bis(4-aminophenoxy)-biphenyl, 2,2-bis[4-4-aminophenoxy)-phenyl]hexafluoropropane, bis[4-(4-aminophenoxy)-phenyl]propane, bis [4-(4-aminophenoxy)-phenyl]sulfone, bis[4-(4-aminophenoxy)-phenyl]sulfone, 1,1'-bis(4-aminophenyl)-clohexane, 9,9'-bis(4-aminopheny10-fluorene,2,2'-bis(4-aminophenyl)-hexafluoropropane, bis(2-aminophenyl)sulfide, bis(4-aminophenyl)sulfide, bis(3-aminophenyl)sulfone, bis(4-aminophenyl)sulfone, 4,4'-diamino-3,3'-dimethyl-diphenylmethane, 3,4'-diaminodiphenyl ether, 4,4'-diaminodiphenyl ether, 3,3'-diaminodiphenyl methane, 3,4'-diaminodiphenyl methane, 2,7-diaminofluorene, 1,5-diaminonaphthalene, 4,4'-diaminooctafluorobiphenyl, 2,5-dimethyl-1, 4-phenylenediamine, 4,4'-ethylenedianiline, 1,3-phenylenediamine, 1,4-phenylenediamine, 2,3,5,6-tetramethyl-1,4-phenylenediamine, m-xylylenediamine, and p-xylylenediamine.

11. The method of claim 1, wherein said polyamic acid has a weight average molecular weight of less than about 15,000 Daltons.

12. The method of claim 1, said composition further comprising a crosslinking agent.

13. The method of claim 1, wherein said heating results in crosslinking of said polyamic acid.

14. The method of claim 1, wherein said substrate is a microelectronic substrate selected from the group consisting of silicon, SiGe, $SiO_2$, $Si_3N_4$, SiON, aluminum, tungsten, tungsten silicide, gallium arsenide, germanium, tantalum, tantalum nitride, coral, black diamond, phosphorous or boron doped glass, $Ti_3N_4$, hafnium, $HfO_2$, ruthenium, indium phosphide, and mixtures of the foregoing.

15. The method of claim 1, wherein said carbon-rich layer has an n value of at least about 1.40.

16. The method of claim 1, said method further comprising:

optionally forming one or more intermediate layers on said carbon-rich layer, there being an uppermost intermediate layer on said carbon-rich layer, if one or more intermediate layers are present on said carbon-rich layer; and forming an imaging layer on said uppermost intermediate layer on said carbon-rich layer, if present, or on said carbon-rich layer, if no intermediate layers are present on said carbon-rich layer.

17. The method of claim 16, said method further comprising:

patterning said imaging layer to form a pattern therein; and transferring said pattern to said intermediate layers on said carbon-rich layer, if present, and to said carbon-rich layer, wherein said pattern comprises a plurality of lines, and said lines exhibit little to no wiggling.

18. The method of claim 17, wherein said patterning comprises:

exposing said imaging layer to light to yield light-exposed portions of the imaging layer; and contacting said imaging layer with a developer after light exposure so as to remove said light-exposed portions.

19. The method of claim 18, wherein said contacting results in portions of said carbon-rich layer being removed, thus forming said lines.

* * * * *